United States Patent
Wood (10) Patent No.: US 7,218,180 B2
(45) Date of Patent: May 15, 2007

(54) LOW NOISE OSCILLATOR (75) Inventor: John Wood, Santa Cruz, CA (US)

(73) Assignee: Multigig, Ltd. (GB)

( * ) Notice: Subject to any disclaimer, the term of this patent is extended or adjusted under 35 U.S.C. 154(b) by 102 days.

(21) Appl. No.: 11/004,613

(22) Filed: Dec. 3, 2004

(65) Prior Publication Data
US 2005/0156680 A1  Jul. 21, 2005

Related U.S. Application Data (63) Continuation-in-part of application No. 10/275,461, filed as application No. PCT/GB01/02069 on May 11, 2001.

(30) Foreign Application Priority Data

| May 11, 2000 | (GB) | ................................ | 0011243.3 |
| Oct. 6, 2000 | (GB) | ................................ | 0024522.2 |
| Feb. 3, 2001 | (GB) | ................................ | 0102700.2 |

(51) Int. Cl.
H03B 5/18   (2006.01)

(52) U.S. Cl. ............ 331/96; 331/107 SL; 331/107 DP; 331/99; 331/57

(58) Field of Classification Search .................. 331/57, 331/96, 99, 107 DP, 107 SL; 333/219
See application file for complete search history.

(56) References Cited

U.S. PATENT DOCUMENTS

| 3,516,021 A | 6/1970 | Kohn | ...................... 331/117 D |
| 3,538,450 A | 11/1970 | Andrea et al. | ................. 331/10 |
| 4,246,550 A | 1/1981 | Cohen | ................... 331/107 DP |
| 4,514,707 A | 4/1985 | Dydyk et al. | ................ 331/107 |

(Continued)

FOREIGN PATENT DOCUMENTS

DE  43 22 701  8/1994

(Continued)

OTHER PUBLICATIONS

Bußmann, M. et al. (1992). "Active Compensation of Interconnect Losses for Multi-GHz Clock Distribution Networks," *IEEE Transactions on Circuits and Systems - II: Analog and Digital Signal Processing*, vol. 39(11): 790-798.

(Continued)

*Primary Examiner*—Arnold Kinkead
(74) *Attorney, Agent, or Firm*—Anthony B. Diepenbrock, III; Dechert LLP (57) ABSTRACT A low noise oscillator constructed using a rotary traveling wave oscillator. The conductors of the rotary traveling wave oscillator provide at any tap position a pair of oppositely phased oscillations and these oscillations have slightly different phases at positions that are slightly different on the conductors. Regeneration devices establish and maintain oscillations on the conductors of the traveling wave oscillator. A regeneration device made from p-channel and n-channel transistors is connected to the conductors of the traveling wave oscillator in such a way that the gate connections of the transistors receive the traveling wavefront before the drains of the transistors receive the wavefront. By the time the regeneration device switches in response to the wavefront arriving at the gates of the transistors, the wavefront has arrived at the drains. This creates little or no disturbance to the wave on the conductors and results in low phase noise.

20 Claims, 10 Drawing Sheets

U.S. PATENT DOCUMENTS

| | | | |
|---|---|---|---|
| 4,686,407 A | 8/1987 | Ceperley | 310/323 |
| 4,749,963 A | 6/1988 | Makimoto et al. | 331/99 |
| 4,875,046 A | 10/1989 | Lewyn | 341/148 |
| 5,117,206 A | 5/1992 | Imamura | 331/158 |
| 5,235,335 A | 8/1993 | Hester et al. | 341/172 |
| 5,361,277 A | 11/1994 | Grover | 375/107 |
| 5,493,715 A | 2/1996 | Humphreys et al. | 455/264 |
| 5,584,067 A | 12/1996 | Buer et al. | 455/302 |
| 5,640,112 A | 6/1997 | Goto et al. | 327/141 |
| 5,652,549 A | 7/1997 | Unterricker et al. | 311/57 |
| 5,754,833 A | 5/1998 | Singh et al. | 395/551 |
| 5,945,847 A | 8/1999 | Ransijn | 326/115 |
| 5,963,086 A | 10/1999 | Hall | 330/10 |
| 5,973,633 A | 10/1999 | Hester | 341/172 |
| 6,078,202 A | 6/2000 | Tomatsuri et al. | 327/145 |
| 6,133,798 A | 10/2000 | Nagano et al. | 331/55 |
| 6,239,663 B1 | 5/2001 | Mizutani | 331/107 SL |
| 6,259,327 B1 | 7/2001 | Balistreri et al. | 331/11 |
| 6,525,618 B2* | 2/2003 | Wood | 331/57 |
| 6,556,089 B2* | 4/2003 | Wood | 331/57 |
| 6,683,503 B2 | 1/2004 | Mizuno et al. | 331/46 |
| 6,816,020 B2* | 11/2004 | Wood | 331/57 |
| 6,853,260 B1* | 2/2005 | Hajimiri et al. | 331/96 |
| 6,922,112 B2 | 7/2005 | Kurd et al. | 331/57 |
| 2002/0190805 A1 | 12/2002 | Wood | 331/107 |
| 2005/0068116 A1 | 3/2005 | Ham et al. | 331/107 |
| 2005/0093637 A1 | 5/2005 | Hajimiri et al. | 331/107 |

FOREIGN PATENT DOCUMENTS

| | | |
|---|---|---|
| EP | 0 478 134 | 4/1992 |
| EP | 0 583 839 A1 | 2/1994 |
| EP | 0 633 662 A1 | 6/1994 |
| EP | 0 696 843 A1 | 2/1996 |
| EP | 0 891 045 | 1/1999 |
| EP | 1 538 752 A1 | 6/2005 |
| GB | 1 247 199 | 9/1971 |
| JP | 60-224205 | 11/1985 |
| WO | WO 95/12263 | 5/1995 |
| WO | WO 00 44093 | 7/2000 |
| WO | WO 2004/102787 A2 | 11/2004 |

OTHER PUBLICATIONS

Divina et al., "The Distributed Oscillator at 4 GHZ," May 1998, pp. 1-4, *IEEE*.

Dunning, Jim, "An All-Digital Phase-Locked Loop with 50-Cycle Lock Time Suitable for High-Performance Microprocessors," *IEEE Journal of Solid-State Circuits*, vol. 30, No. 4, Apr. 1995, pp. 412-422.

Hall, L. et al. (1997). "Clock Distribution Using Cooperative Ring Oscillators,m" *Proceedings of the 17th Conference on Advanced Research in VLSI*, Ann Arbor, MI Sep. 15-16, 1997 pp. 62-75.

Hatsuhiro Kato: "A Dynamic Formulation of Ring Oscillator as Solitary-Wave Propagator," *IEEE Transactions on Circuits and Systems-I: Fundamental Theory and Applications*, vol. 45, No. 1, Jan. 1998 (Jan. 1998), pp. 98-101, XP002168328, the whole document.

Hirofumi Nagashino et al.: "Generation of Traveling Wave Mode in a Chained Neural Oscillator Network Model," *Proceedings of the International Conference on Neural Networks*, (ICNN), US, New York, IEEE, vol.-, Mar. 28, 1993 (Mar. 28, 1993), pp. 1550-1557, XP000379507, ISBN: 0-7803-0999-5, the whole document.

Hiroyuki Yabuki et al.: "Miniaturized Stripline Dual-Mode Ring Resonators and Their Application to Oscillating Devices." *IEEE MTT-s International Microwave Symposium Digest*, US, New York, IEEE, May 16, 1995 (May 16, 1995), pp. 1313-1316, XP000552959, ISBN: 0-7803-2582-6, the whole document.

International Search Report for PCT/GB 01/02069, Jul. 9, 2001.

Kim et al., "ISSCC 2000/Session 26/Analog Techniques/Paper WP 26.3," 2000, pp. 430-431 & 475, *2000 IEEE International Solid-State Circuits Conference*.

Kleveland et al., "Monolithic CMOS Distributed Amplifier and Oscillator," *1999 IEEE International Solid-State Circuits Conference* MP 4.3.

Kleveland, B. et al. (1998). "50 GHz Interconnect Design in Standard Silicon Technology," IEEE MIT-S International Microwave Symposium Digest 3:1913-1916.

Kleveland, B. et al. (1999). "Line Inductance Extraction and Modeling in a Real Chip With Power Grid," *IEEE IEDM Conference*, Washington, D.C. pp. 1-4.

Kral, A., Behbahani, F., and Abidi, A.A., "RF-CMOS Oscillators with Switched Tuning," *Proceedings of the IEEE 1998 Custom Integrated Circuits Conference*, pp. 555-558.

Larrson, H. (1997). "Distributed Synchronous Clocking Using Connected Ring Oscillators," *Master's Thesis in Computer Systems Engineering, Centre for Computer System Architecture*, Halmstad University: Halmstad, Sweden, 43 pages.

Patent Abstracts of Japan, vol. 016, No. 465 (E-1270), Sep. 28, 1992 (Sep. 28, 1992) & JP 04 165809 A (NEC Corp), Jun. 11, 1992 (Jun. 11, 1992) abstract.

Skvor et al., "Novel decade electronically tunable microwave oscillator based on the distributed ampllifier," *IEEE Explore*, Aug. 3, 1992, vol. 28, Issue 17 Abstract.

Wu et al., "A 10GHz CMOS Distributed Voltage Controlled Oscillator 1," 4 pages, submitted to the Department of Electrical Engineering California Institute of Technology.

Yue, P.C. et al. (1998). "On-Chip Spiral Inductors with Patterned Ground Shields for Si-Based RF IC's," *IEEE Journal of Solid-State Circuits* 33(5): 743-752.

Wu, H. et al., "A 10 GHz CMOS Distributed Voltage Controlled Oscillator," *Custom Integrated Circuits Conference, 2000. CICC. Proceedings of the IEEE 2000*, May 21-24, 2000, pp. 581-584.

Bhattacharyya, K. & Szymanski, T., "1.2V 1-10 GHz Travelling Wave Amplifiers Using Coplanar Waveguides As On-Chip Inductors," *IEEE Rawcon Conference*, 2004.

Deutsch, A. et al., "Modeling And Characterization Of Long On-Chip Interconnections For High-Performance Microprocessors" *IBM J Res. Develop.*, vol. 39, No. 5, Sep. 1995, pp. 547-567 (p. 549).

Guckenberger, K., "Differential Distributed Amplifier And Oscillator In SiGe BiCMOS Using Close-Packed Interleaved On-Chip Transmission Lines," *2004 IEEE*, pp. 68-71.

Lee, J., & Razavi, B., "A 40G$_B$/s Clock And Data Recovery Circuit in 0.18 M CMOS Technology," *2003 IEEE International Solid-State Circuits Conference*, Session 13, Paper 13.7.

Le Grand de Mercey, G., "A 18GHz Rotary Traveling Wave VCO in CMOS With I/Q Outputs," *Solid-State Circuits Conference, 2003*, Sep. 16-18, 2003, pp. 489-492 (Paper & Thesis with Abstract).

MultiGIG Ltd: Rotary Explorer v0.5 User's Guide, 2000, pp. 1-33.

Miller, B. & Conley, R., "A Multiple Modulator Fractional Divider," *IEEE Transactions on Instrumentations and Measurement*, vol. 40, No. 3, Jun. 1991, pp. 578-583.

Savoj, J. & Razavi, B., "A 10G$_B$/s CMOS Clock and Data Recovery Circuit With Frequency Detection," *2001 IEEE International Solid-State Circuits Conference*, Session 5.

Wood, J, et al., "Multi-Gigahertz Low-Power, Low-Skew, Rotary Clock Scheme," *2001 IEEE International Solid-State Circuits Conference*, Session 25, Paper WO 25.5, Feb. 4-8, 2001, San Francisco Marriottt Hotel (paper & slideshow prints).

Wood, J. et al., "Rotary Traveling-Wave Oscillator Arrays: A New Clock Technology," *IEEE Journal of Solid-State Circuits*, Nov. 2001, vol. 36, No. 11, pp. 1654-1665.

International Search Report, PCT/GB02/05514, Feb. 13, 2004.

* cited by examiner

LOW NOISE OSCILLATOR

CROSS-REFERENCE TO RELATED APPLICATIONS

This application is a continuation-in-part of pending U.S. application Ser. No. 10/275,461, filed Apr. 7, 2003, and titled "ELECTRONIC PULSE GENERATOR AND OSCILLATOR", which application is incorporated by reference into the present application.

This application claims the benefit of application Ser. No. 10/275,461, which is a national stage application of PCT application, PCT/GB01/02069, publication number WO 01/89088, filed May 11, 2001, and this application and the PCT/GB01/02069 application claim priority to GB0011243.3, filed May 11, 2000, GB0024522.2, filed Oct. 6, 2000, and GB0102700.2, filed Feb. 3, 2001. The PCT/GB01/02069, GB0011243.3, GB0024522.2, and GB0102700.2 are incorporated by reference into the present application.

FIELD OF THE INVENTION

The present invention relates generally to traveling wave oscillators and more specifically to traveling wave oscillators that achieve low levels of phase noise.

DESCRIPTION OF THE RELATED ART

Phase noise (rms degrees or rms picoseconds), in an oscillator, is the unintentional, possibly rapid, modulation of the phase of a periodic signal usually from thermal noise, shot noise and/or flicker noise in active and passive devices that are part of the oscillator and surrounding system. Phase noise manifests itself, in time, as jitter and, in frequency, as a broadening of the generated waveform, or noise sidebands. The sideband level is generally highest close to the fundamental frequency of the oscillator. Phase noise is a serious concern if the periodic signal is used in data sampling applications, because such jitter leads to error in the sampled signal. A variety of sources can introduce phase noise into an oscillator. These sources include transistors involved in generating the periodic waveform, the power supply to which such transistors are connected, or other non-transistor sources.

Thus, there is a need for an apparatus and method for generating a periodic signal that has low phase noise to minimize errors introduced by phase noise.

BRIEF SUMMARY OF THE INVENTION

The present invention is directed towards such a need. An embodiment of the present invention is a low noise oscillator that includes one or more transmission line segments, an odd number of passive connection means, and a plurality of regeneration devices. Each transmission line segment has between its ends a length of spaced apart first and second conductors and each length of conductor is electrically continuous. The passive connection means couple the ends of the segments to form a closed loop of segments and the passive connection means. The regeneration devices are located at various spaced-apart positions on the loop and are connected between the first and second conductors of a segment. The regeneration devices are operative to establish and maintain on the loop a wave traveling around the loop. The traveling wave includes a voltage wave between the first and second conductors and a single lap of the wave around the loop defines a propagation time. Each of the passive connection means causes the voltage of the traveling wave between the first and second conductors to reverse polarity, so that, at any location on a segment, there is a pair of oppositely phased oscillations having a period equal to twice the propagation time.

In one embodiment, each of the regeneration devices includes first and second inverting amplifiers. The first amplifier has an input connected at a tap position to the first conductor and an output connected at an output position to the second conductor. The second amplifier has an input connected at a tap position to the second conductor and an output connected at an output position to the first conductor. Each amplifier has an associated delay time for responding to a change on its input. For each amplifier, there is a physical offset between its output position and its tap position so that there is a time difference between the traveling wave arriving at the tap position and arriving at the output position, the time difference being approximately equal to the amplifier's associated delay time.

A method in accordance with the present invention is a method for creating low phase noise oscillations. The method includes establishing a traveling wave on a loop of one or more transmission line segments, where each segment has between its ends a length of spaced apart and electrically continuous first and second conductors and where an odd number of passive connection means couple the ends of the one or more segments to form a closed loop. The traveling wave includes a voltage wave between the first and second conductors and the wave is maintained by a plurality of regeneration devices connected between the conductors of the transmission line segments. Each connection means reverses the polarity of the voltage wave between the conductors. Each regeneration device includes back-to-back inverting amplifiers, each of which has an input and an output and a delay time for responding to a change on the input. The method further includes causing a difference in time between the wave arriving at the input of each amplifier and the wave arriving at the output of each amplifier, where the time difference is approximately equal to the amplifier's delay time.

One advantage of the present invention is that a plurality of different phases are available from the oscillator, the different phases being available at different tap positions on the transmission line segments and each having low phase noise.

Another advantage is that the oscillator takes up very little physical space when the transmission line segments are folded.

Yet another advantage is that the oscillator consumes very little power.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1A:
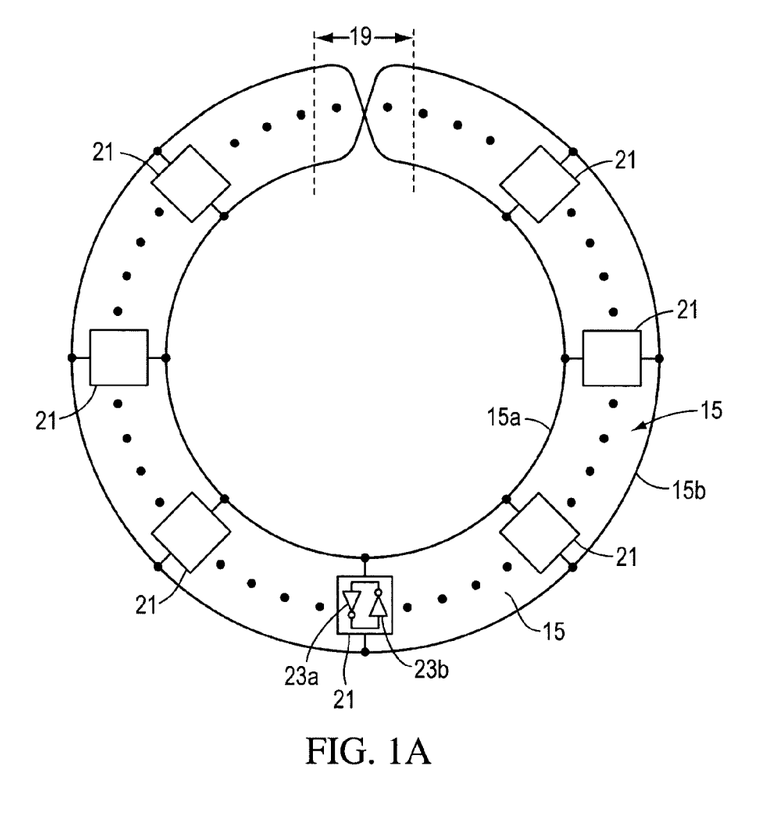
FIGS. 1A and 1B show a rotary traveling wave oscillator.
Figure 1B:
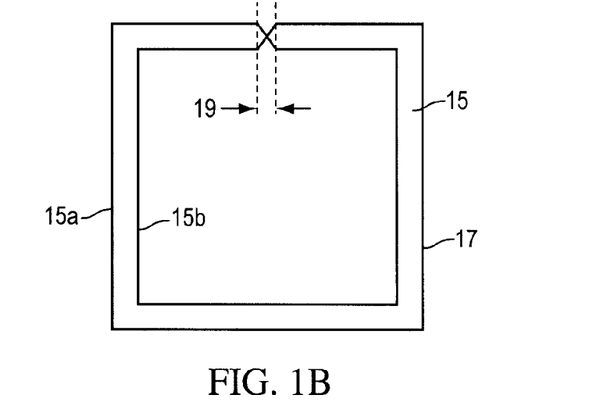

FIG. 1 shows a transmission-line 15 as a structure that is physically as well as electromagnetically endless, specifically comprising a single continuous "originating" conductor formation 17 shown forming two appropriately spaced generally parallel traces as loops 15a, 15b with a crossover at 19 that does not involve any local electrical connection of the conductor 17. The length of the originating conductor 17, taken as S, corresponds to two 'laps' of the transmission-line 15 as defined between the spaced loop traces 15a, 15b and through the cross-over 19. The crossover 19 produces a Moebius strip effect where edge traces of the loops 15a, 15b invert from lap to lap. Alternatively, the structure 15 can be viewed as one or more transmission line segments, where each segment has between its ends a length of spaced apart first and second conductors 15a, 15b. Each conductor is electrically continuous, meaning that there are no breaks in the conductors and no active elements in series with the conductors. A passive connection means 19 connects the ends of each segment (the same segment, if there is only one segment) to form a closed loop. Only an odd number of connection means 19 is permitted. Each connection means 19 causes a reversal in the voltage polarity, without the use of active devices, between the first and second conductors. In one embodiment, the connection means is a crossover connection 19, as shown in FIG. 1A.

As a pulse generator or an oscillator, the transmission-line 15 has associated plural spaced active means 21 conveniently of bi-directional switching/amplifying nature shown as two inverters 23a, 23b connected back-to-back between the conductors 15a, 15b, in FIG. 1A. Alternative active regenerative means 21 could rely on negative resistance, negative capacitance or be otherwise suitably non-linear and regenerative (such as Gunn diodes). FIG. 1 shows the respective input and output terminals of each circuit 21 connected to the transmission line 15 between the conductors 15a, 15b at substantially maximum spacing apart along the effectively single conductor 17; thus, each is located substantially halfway around the transmission-line 15 relative to the other.

Figure 2A:
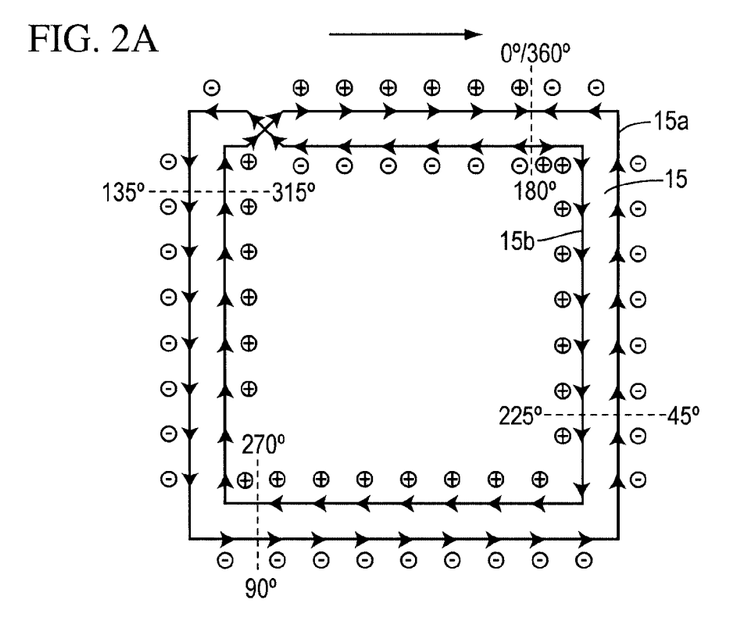
FIGS. 2A and 2B show the various phases of the rotating wave for each direction of rotation.
Figure 2B:
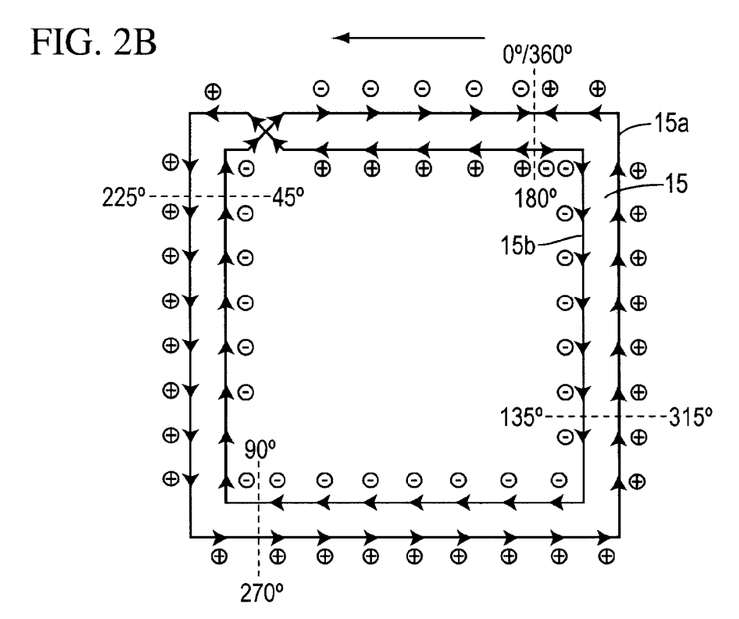

FIG. 2 shows a convenient simplified/idealized representation that omits the active means 21. These can be any odd number of crossovers 19, and the transmission line loop 15 can be any shape, including geometrically irregular, as long as it has a length appropriate to the desired operating frequency. A signal leaving an amplifier 21 arrives back inverted after a full 'lap' of the transmission-line 15, which is traversed in a propagation time Tp. This effectively defines a pulse width or half-cycle oscillation time of a full-cycle bipolar operating frequency.

Initially, random amplification of inherent noise within the amplifiers 21 quickly settles to an effective oscillation at a fundamental frequency F, where $F=1/(2Tp)$, and this occurs typically within nanoseconds.

A small number of spaced-apart inverter pairs 23a and 23b connected between the bandwidth-limited conductors 15a, 15b, leads to a substantially sinusoidal waveform at the fundamental frequency. A sufficient number of spaced-apart inverter pairs 23a and 23b connected between the bandwidth-limited conductors 15a, 15b and the fast switching times of the inverters 23a, 23b lead to a strongly square waveform, which contains odd harmonics of the fundamental frequency F effectively reinforced. At the fundamental oscillating frequency F, the terminals of the amplifiers 21 appear substantially unloaded, due to the transmission-line 15 being 'closed-loop' without any form of termination, which results very desirably in low power dissipation and low drive requirements. It can also be desirable and advantageous to alter, independently, the impedance and resistance of the conductors and the conductance and capacitance between the conductors of the transmission line 15. Such alterations change the propagation constant, y, of the line, without changing its physical length. Changing the propagation constant without changing the physical length of the line is sometimes called changing the electrical length of the line.

The evident continuous DC path directly connecting all inputs and outputs of the inverters has no stable DC operating point, and this DC instability is compounded by the regenerative (+Ve feedback) action of the back-to-back inverters. For any inverter and its output signal path with reference to the ground plane, its output arrives back at its input after one lap of the transmission line 15, in both the clockwise or anticlockwise direction, both waves being launched and arriving back together. Self-sustaining, reinforcing action occurs when the input arrives with a phase that differs with the output phase by 180 degrees and the additional 180-degree phase shift of the inverter contributes to such reinforcing.

Coherent pulse or oscillation operation occurs when the signal in the transmission line meets this requirement for all connected inverters. In such a case, all inverters are working in a coordinated manner resulting in known phase relationships between all points on the transmission line. A single rotating traveling wave, rotating either clockwise or anticlockwise, on the line, meets this criterion. FIGS. 2A and 2B show (i) the line current flow by arrow-heads, (ii) the polarity by circled plus and minus signs, (iii) the direction of rotation by full arrows, and (iv) the phase from an arbitrary 0/360 degree position, for a two-lap traverse of the path 15. During rotation, the wavefront incident upon an inverter overrides its previous drive direction due to the low impedance of the wave compared to the input impedance of a single transistor. Once overridden, the inverters contribute to imposing the new wave polarity by connecting the transmission line terminal to the correct power source polarity. This maintains 'top-up' energy to give substantially constant amplitude in the presence of (mainly resistive) losses in the transmission line. Switching by the transistors also helps prevent the build-up of any counter-direction waves, effectively acting as wave gates.

Once the structure has established a rotation in one direction, the rotation can change only by removing and reversing the electromagnetic energy in the structure. To complete a full bipolar cycle of oscillation, a wave must make two 'laps' of the structure in order to complete a 360 degree phase shift, i.e., each complete lap is only 180 degrees of phase shift. Rapid rise and fall times are a consequence of the short transit-time of the MOSFETs, typically 1 ps to 5 ps range in VLSI CMOS, and a short length of transmission line between them. The transistors do not drive a capacitive load, as load and gate are switched by the incident wave, i.e., operation is transit time limited, and the waves are square with very good symmetry between phases, where there are a sufficient number of regeneration devices so that the length between the regeneration devices is short.

Figure 3A:
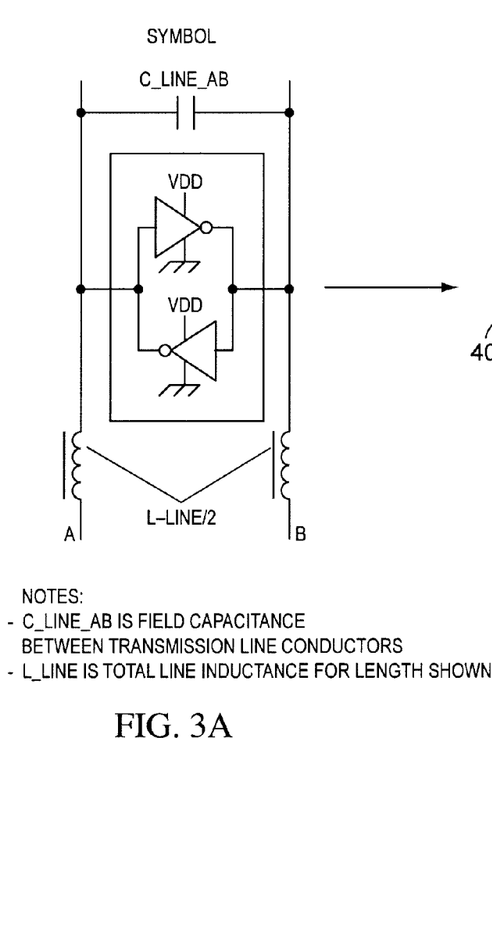
FIGS. 3A and 3B show the detail of the regeneration devices connected between the transmission line conductors of the traveling wave oscillator.
Figure 3B:
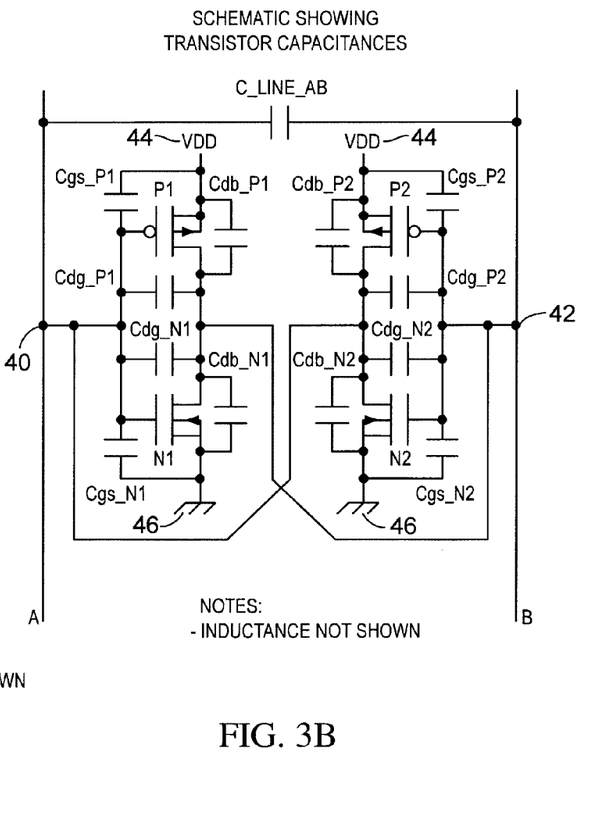

FIG. 3A shows the connection of the regeneration devices between the conductors of the transmission line segment in more detail and FIG. 3B shows the internal transistor structure, in one embodiment, of the regeneration devices connected between the conductors of the transmission line segment. As is apparent from the figure, conductor A is connected to the gate inputs of transistors P1 and N1 and to the junction of the drains of transistors P2 and N2 at a first tap position 40. Conductor B is connected to the gate inputs of P2 and N2 and to the junction of drains of P1 and N1 at a second tap position 42. The sources of P1 and P2 are connected to VDD 44 and the sources of N1 and N2 are connected to ground 46, and it is these power and ground connections that provide energy to the wave to make up for the losses. In another embodiment, the internal transistor structure of an inverter has a passive load device, such as a resistor, in place of either the p- or n-channel transistors. In yet another embodiment, the inverter is constructed from bipolar transistors. In yet another embodiment, the inverter is constructed from a combination of bipolar and FET transistors.

In operation, when a differential mode wave travels on the A and B conductors (say, with a positive voltage on A with respect to B) and reaches the first tap position 40, the inverter comprising P1 and N1 begins to switch so as to make N1 conductive, reinforcing the voltage on conductor B. At about the same time, the wave reaches the second tap position 42 and the inverter comprising P2 and N2 begins to switch to make P2 conductive, reinforcing the voltage on conductor A. Thus, the switching tends to reinforce the wave traveling by the tap positions.

Figure 4:
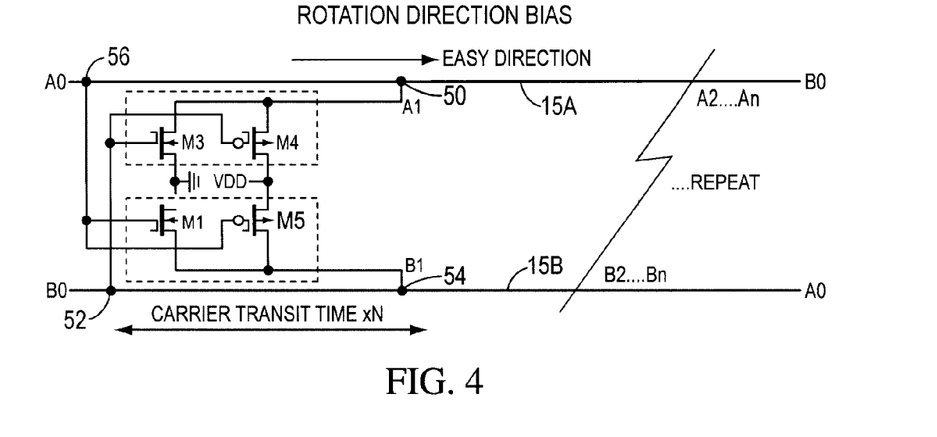
FIG. 4 shows tap and output connections to bias the rotation direction of the traveling wave.

FIG. 4 shows the same regeneration device except with different tap positions. In particular, the output position A1 50 on conductor A for the drains of M3 and M4 is offset from the tap position B0 52 of the gates of M3 and M4 on conductor B. Similarly, the output position B1 54 on conductor B is offset from the tap position of A0 56 of the gates of M1 and M5. This configuration promotes oscillation startup in the "Easy Direction," as shown, because the drain outputs have a coherent delay in the Easy Direction. Another effect of this arrangement is that the waveforms at the taps have faster rise and fall times.

Figure 5:
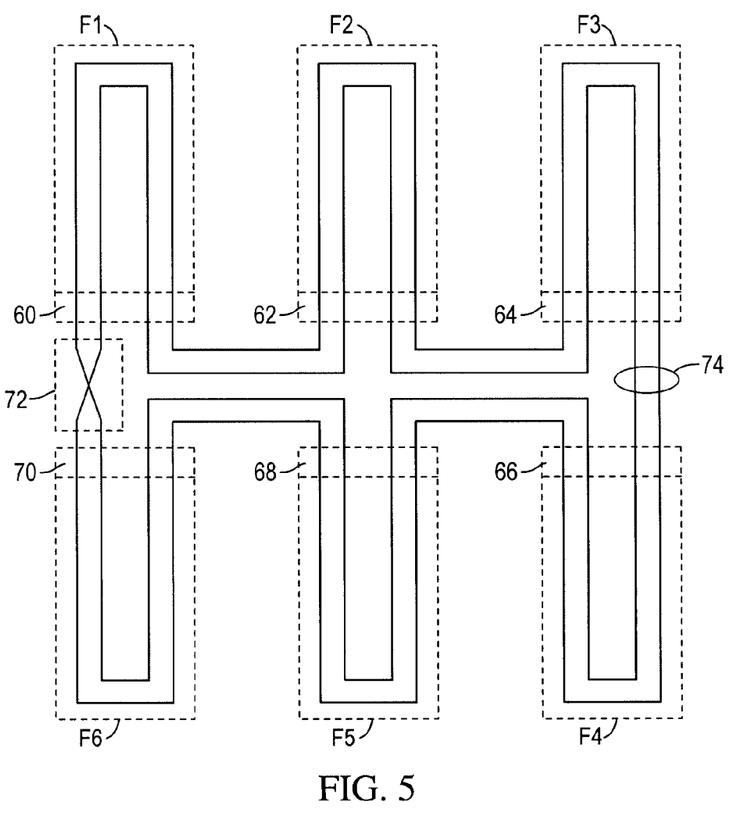
FIG. 5 shows a folded version of a traveling wave oscillator.

FIG. 5 shows a folded version of a traveling wave oscillator. The transmission line segment has a plurality of folds F1–F6, which permit a longer length segment to fit into a given area. Each fold is essentially an unclosed loop having a base 60, 62, 64, 66, 68, 70 at or near non-continuous ends of the loop. In the figure, a crossover 72 connects the ends of the transmission line segment 74.

Figure 6:
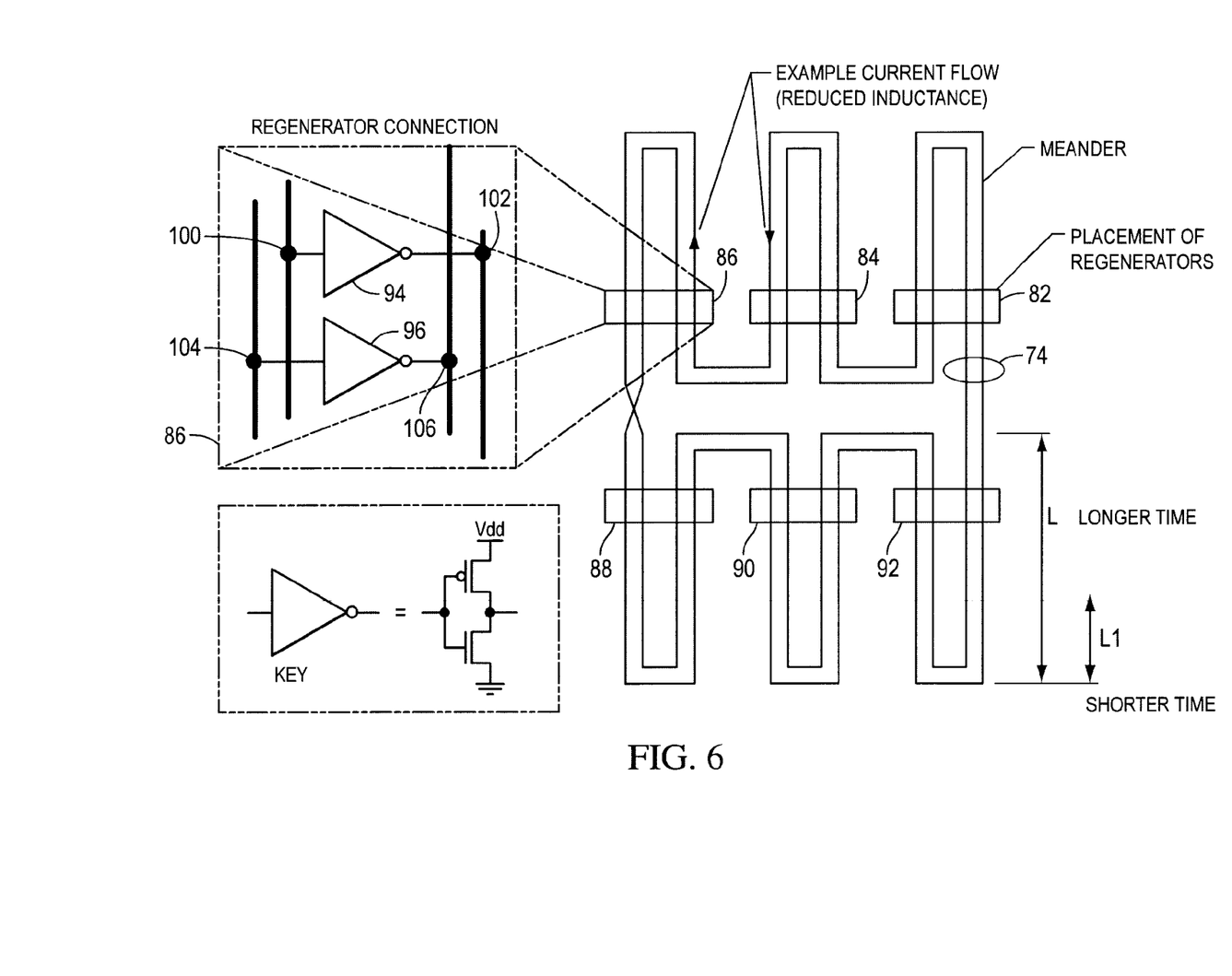
FIG. 6 shows the regeneration devices connected to the folded version of the traveling wave oscillator.

FIG. 6 shows regeneration devices connected to the folded version of the traveling wave oscillator. There are six regeneration devices 82, 84, 86, 88, 90, 92 distributed along the line 74. A regeneration device, in one embodiment, comprises a pair of back-to-back inverters 94, 96, one of which 86 is shown in detail in the inset. Each of the pair of back-to-back inverters is connected at or near the base of the fold, as shown. For each inverter 94, 96 of the pair, this connection effectively implements a lineal offset or displacement between the tap position 100, 104, and its respective output position 102, 106, the offset being approximately the length of the fold.

For lines without or without folds, when the tap position and output position are offset along the rotary traveling wave clock lines such that the wave arrives at the tap position before it arrives at the output position (and this time period approximates the time of gate-drain delay), current is delivered to the line at approximately the same time as the rotary edge arrives at the output position. Under these circumstances, it is believed that the amount of current delivered has little effect on the period of the oscillator. The result is that transistor noise currents and transistor current variation due to VDD changes have little effect on the period.

Figure 9:
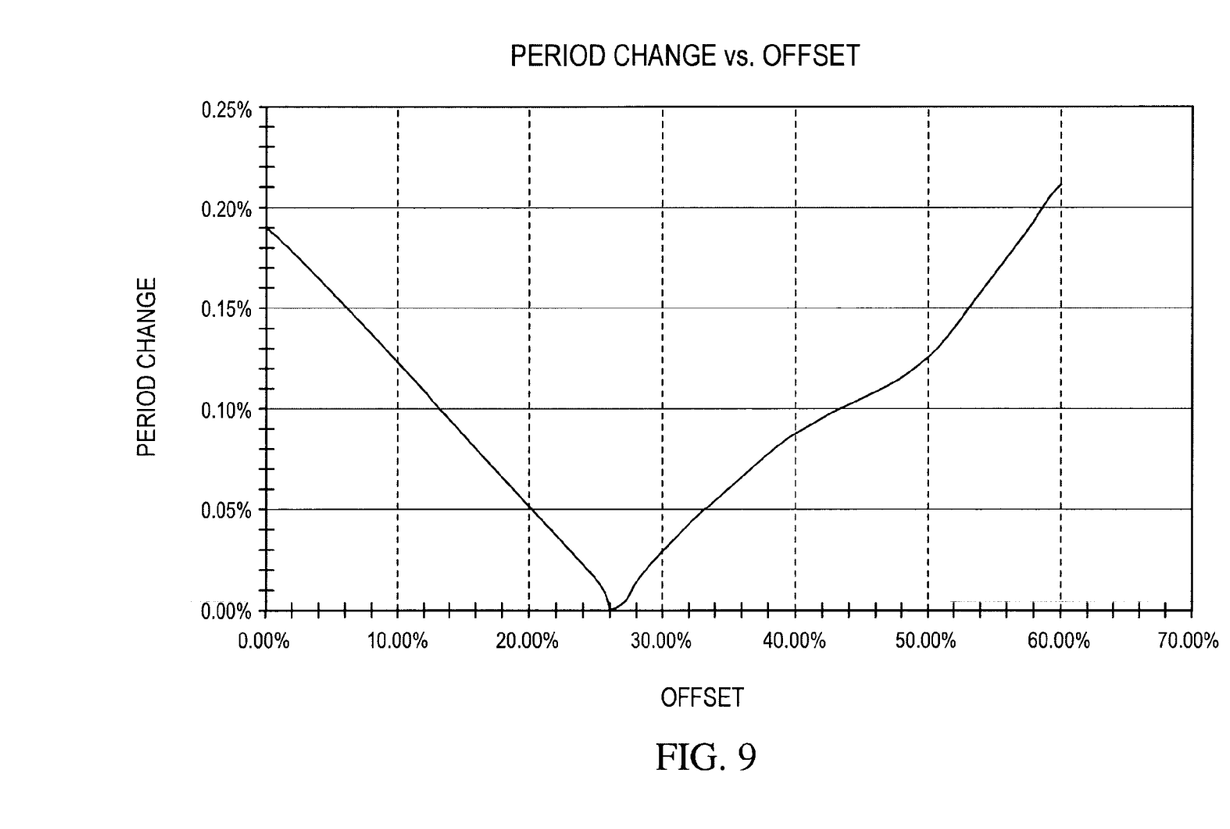
FIG. 9 shows a plot of phase noise versus tap offset.

For lines with or without folds, the optimal displacement for low phase noise and low VDD dependency can be found through simulation. Using SPICE, it is straightforward to find the offset at which there is minimum VDD sensitivity to period (which is approximately the lowest phase noise position). A script that generates a Spice file contains an LCR approximation of the rotary clock. Inductors are created with nodes that represent the tap positions. Multiple Spice runs are executed, and in each run, the VDD is modulated to introduce a source of noise. The resulting period of the clock is monitored for variation. FIG. 9, discussed below, shows the results of one such simulation.

Figure 7:
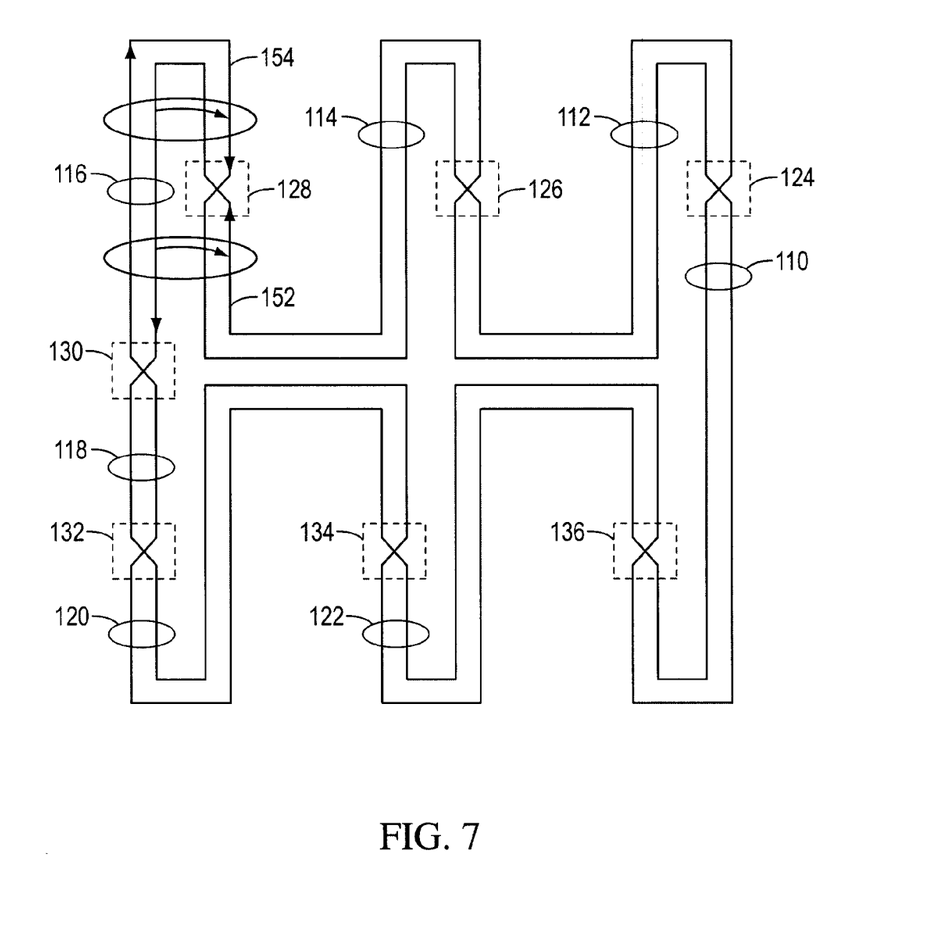
FIG. 7 shows a folded version of a traveling wave oscillator with each segment having twists to reduce coupling between adjacent portions.

FIG. 7 shows a folded version of a traveling wave oscillator having a plurality of segments 110, 112, 114, 116, 118, 120, 122 and an odd number of crossovers (or twists) 124, 126, 128 130, 132, 134, 136. In particular, the loop of segments and crossovers comprises, in sequence, segment 110, crossover 124, segment 112, crossover 126, segment 114, crossover 128, segment 116, crossover 130, segment 118, crossover 132, segment 120, crossover 134, segment 122, and crossover 136. The twists ensure that co-parallel differential pairs have minimal coupling to one another. Ideally, the placement of a twist is such that coupling to a conductor 152 on one side of a twist is mitigated by coupling to the conductor 154 on the other side of the twist. The arrows illustrate currents that might exist at one moment in time on the line, current flowing in one direction on conductor 152 and the other direction in conductor 154, indicating that net differential inductive coupling is reduced by this arrangement. Rotary clock layouts featuring periodic twists also have a reduced response to external magnetic fields lines that cut the twisted wires, i.e., a positive inducement of a signal in one segment by an external field is substantially cancelled by a negative inducement of a signal caused by the same field in a sequential segment because of the twisting.

Figure 8A:
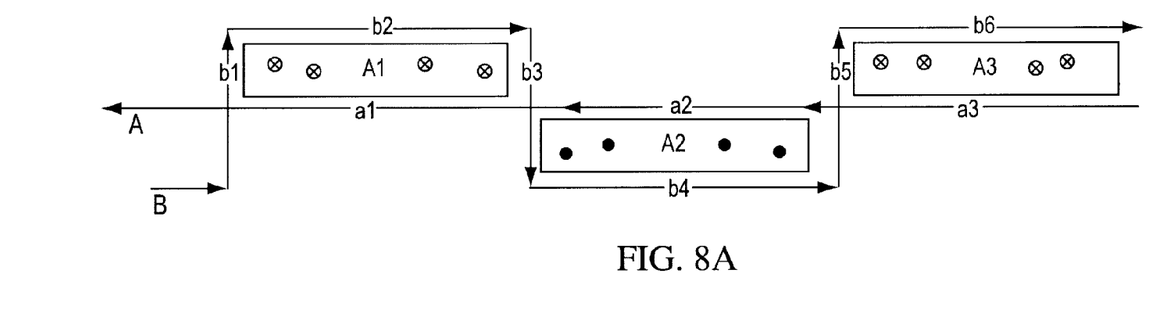
FIG. 8A shows a portion of a transmission line segment before folding.
Figure 8B:
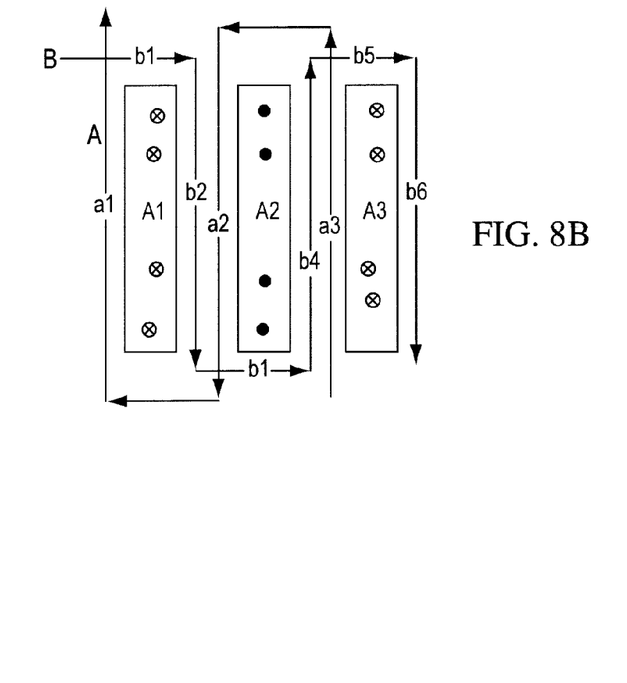
FIG. 8B shows a portion of a transmission line segment after folding.

FIG. 8A shows a portion of a transmission line segment with twists. As shown, areas A1 and A3 have a magnetic field that is opposite in orientation from area A2, thus creating a canceling effect among the areas. When the segment is folded as shown in FIG. 8B, these areas maintain their orientation, but currents in conductors pairs (a2, b2), and (a3, b4) become co-parallel. This increases the mutual inductance between these conductor pairs and thus the overall inductance of the structure. High inductance increases transmission-line impedance and reduces power consumption but at the expense of possible coupling of the less well-contained magnetic fields with other circuitry, and at the expense of increased susceptibility to external fields.

Figure 8C:
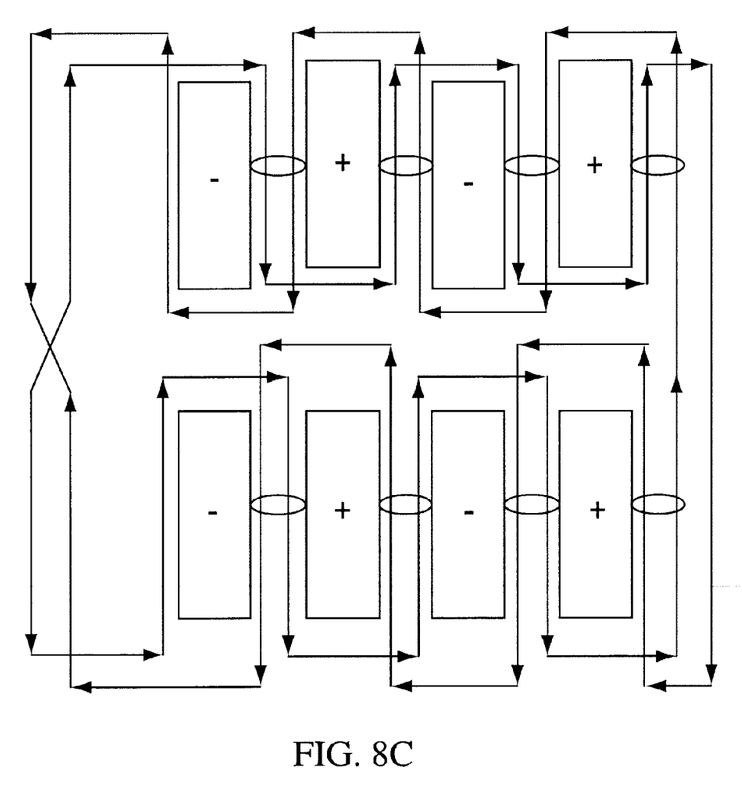
FIG. 8C shows a folded version of a traveling wave oscillator that increases inductance of the transmission line system.

Rotary clock layouts have an inherent advantage compared to spiral inductor layouts in that the magnetic fields of the structure of FIG. 8C still have oppositely oriented areas, which preserves the canceling effect.

The choice of high, medium or low inductance lines depends on the tradeoff between the beneficial effects of high inductance and the negative effect of susceptibility for interference from external electromagnetic fields.

FIG. 9 shows a graph of phase noise (jitter) versus tap offset ratio for a particular oscillator. The horizontal axis represents the relative offset as a fraction of the distance between equally spaced regeneration devices. The vertical axis represents the factional change in the nominal period of the oscillator. According to the graph, there is a relative minimum at a particular relative offset of about 26% for the particular oscillator. This relative minimum may not be the same for any particular oscillator constructed in accordance with the present invention. Each oscillator is likely to have different offsets at which the noise is minimized. Even though the exact minimum is the most desirable point to achieve, relative offsets larger or smaller than offset at which the minimum noise is achieved still result in a large reduction in phase noise. In other words, some amount of relative offset, say less than 60%, achieves significant advantages.

Figure 10:
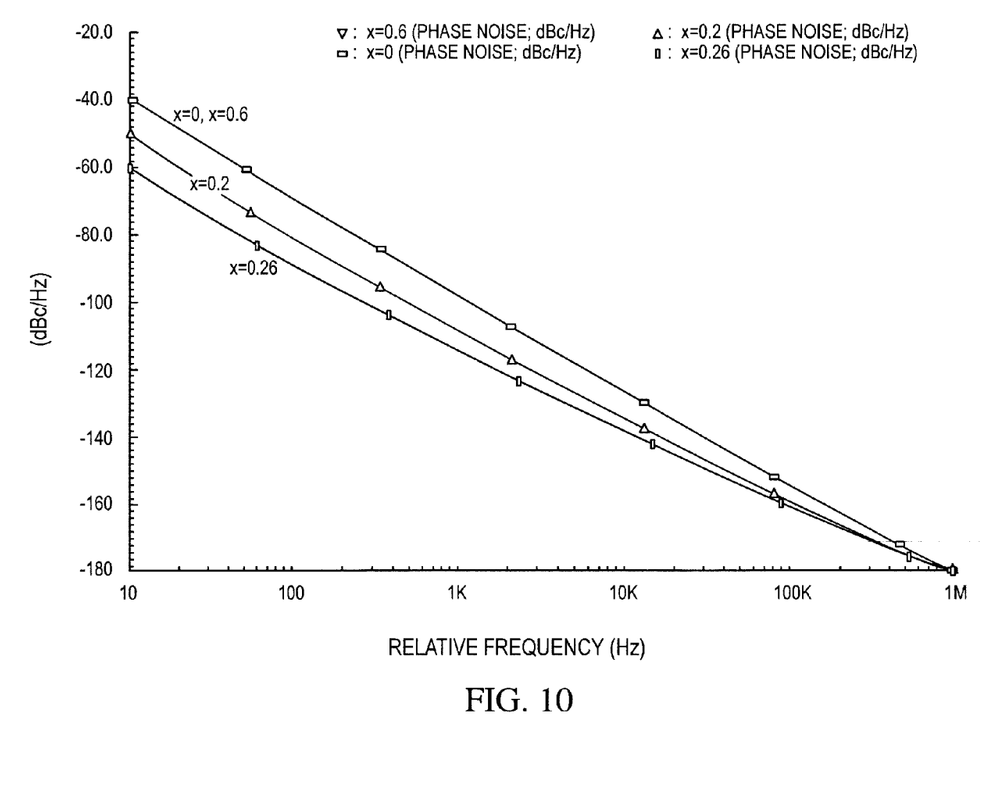
FIG. 10 shows a plot of the sideband noise spectrum for various frequency offsets.

FIG. 10 shows a graph of the sideband noise spectrum in dBc/Hz versus frequency offset from the carrier for a few relative tap offsets. A relative tap offset of approximately 26% reduces the noise power at the 10 Hz offset from the carrier (the nominal oscillator frequency) by about 20 dB, which is a factor of 100 reduction in power.

Although the present invention has been described in considerable detail with reference to certain preferred versions thereof, other versions are possible. Therefore, the spirit and scope of the appended claims should not be limited to the description of the preferred versions contained herein.

What is claimed is:

1. A low noise oscillator comprising:
   one or more transmission line segments, each segment having ends and a length of spaced apart first and second conductors therebetween, each length of conductor being electrically continuous;
   an odd number of passive connection means coupling the ends of the one or more segments to form a closed loop of segments and the passive connection means; and
   a plurality of regeneration devices located at various spaced-apart positions on the loop and connected between the first and second conductors of a segment,
   wherein the regeneration devices are operative to establish and maintain on the loop a wave traveling around the loop, the traveling wave wave including a voltage wave between the first and second conductors, a single lap of the wave around the loop defining a propagation time, and
   wherein each of the passive connection means causes the voltage of the traveling wave between the first and second conductors to reverse polarity, so that, at any location on a segment, there is a pair of oppositely phased oscillations having a period equal to twice the propagation time.

2. A low noise oscillator as recited in claim 1,
   wherein the traveling wave travels in a particular direction around the loop; and
   wherein each of the regeneration devices includes first and second inverting amplifiers, the first amplifier having an input connected at a tap position to the first conductor and an output connected at an output position to the second conductor, the second amplifier having an input connected at a tap position to the second conductor and an output connected at an output position to the first conductor, each amplifier having an associated delay time for responding to a change on its input,
   wherein, for each amplifier, there is a physical offset between its output position and its tap position so that there is a time difference between the traveling wave arriving at the tap position and arriving at the output position, said time difference being approximately equal to the amplifier's associated delay time.

3. A low noise oscillator as recited in claim 2, wherein the conductors of each transmission line segment are routed with a plurality of folds, each having a base at which the first and second inverting amplifiers are connected between the first and second conductors, each fold having a length that provides physical offset between the tap position and the output position.

4. A low noise oscillator as recited in claim 3,
   wherein the conductors of each transmission line segment have inductance and resistance, and between the conductors conductance and capacitance that determine the propagation time of the traveling wave; and
   wherein the inductance, resistance, capacitance, and conductance are separately or jointly adjusted to tune the time difference.

5. A low noise oscillator as recited in claim 2, wherein for each inverting amplifier the tap position is altered to tune the physical offset to the associated delay time of the amplifier.

6. A low noise oscillator as recited in claim 2, wherein the tap positions of each inverter inverting amplifier are offset by the same amount.

7. A low noise oscillator as recited in claim 1, wherein the conductors of the transmission line segment are together routed with a plurality of folds so as to reduce the total space the oscillator occupies.

8. A low noise oscillator as recited in claim 1,
   wherein the conductors of the transmission line segments are together routed with a plurality of folds and the passive connection means are crossovers; and
   wherein each crossover is positioned to approximately balance coupling from an adjacent conductor that is parallel and in proximity to a conductor continuous through the crossover.

9. A low noise oscillator as recited in claim 1,
   wherein the conductors of the transmission line segments are each routed with a plurality of folds and the passive connection means are crossovers; and
   wherein folds of each of the conductors are offset from each other to increase the inductance of the segments.

10. A low noise oscillator as recited in claim 1, wherein the inverting amplifiers are CMOS inverters.

11. A low noise oscillator as recited in claim 1, wherein the inverting amplifiers are MOS inverters.

12. A low noise oscillator as recited in claim 1, wherein the inverting amplifiers are bipolar inverters.

13. A low noise oscillator as recited in claim 1, wherein the inverting amplifiers are biFET inverters.

14. A low noise oscillator as recited in claim 1,
   wherein the inverting amplifiers are CMOS inverters, each having a pair of gate inputs connected, respectively, to a first and second tap position on a segment and an output connected to an output position,
   wherein, for each gate input, each inverting amplifier has an associated delay time for responding to a change thereon; and wherein, for each amplifier, there is a physical offset between each tap position and the output position, such that there is a time difference between the traveling wave arriving at each tap position and the traveling wave arriving at the output position, said time difference being approximately equal to the associated delay time.

15. A low noise oscillator as recited in claim 1,
wherein the traveling wave travels in a particular direction around the loop; and
wherein each of the regeneration devices includes a first inverter and a second inverter, the first and second inverters each including a p-channel and n-channel transistor, each transistor having a gate and a channel between a source and a drain node, the source node of each p-channel transistor being connected to a supply voltage node, the source node of each n-channel transistor being connected to a reference voltage node,
wherein the gates of the p-channel and n-channel of the first inverter are connected to the first conductor at first and second tap positions, respectively, and the drains are connected to the second conductor at a first output position,
wherein the gates of the p-channel and n-channel of the second inverter are connected to the second conductor at first and second tap positions, respectively, and the drains are connected to the first conductor at a second output position,
wherein for each gate, the inverter has an associated delay time for responding to a change thereon,
wherein, for each inverter, there is a physical offset between each tap position and the output position such that there is a time difference between the traveling wave arriving at each tap position and the traveling wave arriving at the output position, the time difference being approximately equal to the associated delay time of the inverter.

16. A low noise oscillator as recited in claim 15, wherein, for each inverter, each tap position is altered to tune the physical offset to the associated delay time.

17. A low noise oscillator as recited in claim 15, wherein, for each inverter, each tap position has the same physical offset.

18. A method for creating low phase noise oscillations, the method comprising:

establishing a traveling wave on a loop of one or more transmission line segments, wherein each segment has between its ends a length of spaced apart and electrically continuous first and second conductors and an odd number of passive connection means coupling the ends of the one or more segments to form a closed loop, the traveling wave including a voltage wave between the first and second conductors and being maintained by a plurality of regeneration devices connected between the conductors of the transmission line segments, each connection means for reversing the polarity of the voltage wave between the conductors, wherein each regeneration device includes back-to-back inverting amplifiers and each amplifier has an input and an output and a delay time for responding to a change on the input; and causing a difference in time between the traveling wave arriving at the input of each amplifier and the traveling wave arriving at the output of each amplifier, said time difference being approximately equal to the amplifier's delay time.

19. A method for creating low phase noise oscillations as recited in claim 18, wherein each transmission line segment has a plurality of folds.

20. A method for creating low phase noise oscillations as recited in claim 18,
wherein the inverting amplifiers are CMOS inverters, each having a pair of gate inputs connected, respectively, to a first and second tap position on a segment and an output connected to an output position,
wherein, for each gate input, each inverting amplifier has an associated delay time for responding to a change thereon;
wherein causing a difference in time includes
causing a first difference in time between the first tap position and the output position and
causing a second difference in time between the second tap position and the output position, said time differences between the first tap position and the output position and the second tap position and the output position being approximately equal to the associated delay times.

* * * * *